United States Patent [19]

Yoshida

[11] Patent Number: 4,875,049
[45] Date of Patent: Oct. 17, 1989

[54] AUTOMATIC LEVEL CONTROL CIRCUIT FOR AN AD CONVERTOR

[75] Inventor: Yasuharu Yoshida, Tokyo, Japan
[73] Assignee: NEC Corporation, Tokyo, Japan
[21] Appl. No.: 157,154
[22] Filed: Feb. 11, 1988

Related U.S. Application Data

[63] Continuation of Ser. No. 795,142, Nov. 5, 1985, abandoned.

[30] Foreign Application Priority Data

Nov. 6, 1984 [JP] Japan ................... 59-233826

[51] Int. Cl.⁴ .......................................... H03M 1/78
[52] U.S. Cl. .................... 341/159; 341/139; 341/163
[58] Field of Search ............ 341/128, 139, 158, 159, 341/163

[56] References Cited

U.S. PATENT DOCUMENTS

| | | | |
|---|---|---|---|
| 3,544,779 | 12/1970 | Farrow | 340/347 AD |
| 3,872,434 | 3/1975 | Duvall | 340/347 AD |
| 4,110,745 | 8/1978 | Ninomiya | 341/159 |
| 4,419,657 | 12/1983 | Gagnon | 340/347 AD |
| 4,475,210 | 10/1984 | Couch | 375/76 |
| 4,523,180 | 6/1985 | Kuboki et al. | 341/158 |
| 4,635,036 | 1/1987 | Yoshizawa | 341/159 |

FOREIGN PATENT DOCUMENTS 0120416 3/1984 European Pat. Off. .

Primary Examiner—William M. Shoop, Jr.
Assistant Examiner—Gary J. Romano
Attorney, Agent, or Firm—Sughrue, Mion, Zinn, Macpeak & Seas

[57] ABSTRACT

An automatic level control circuit for a multi-level quadrature amplitude-modulated (QAM) demodulator having a QAM detector, which produces baseband in-phase (P) and quadrature (Q) signals in response to an input QAM carrier wave, and two analog-digital (A/D) convertors which convert the Q and P signals into two parallel digital signals. Automatic level control of the input level of the baseband signal to the A/D convertor is maintained constant by the combination of a reference signal generator in a feed back loop with each A/D convertor. The A/D convertor produces a decoded digital signal and the reference voltage generator, in response to those signals, provides reference voltage to the A/D convertor that are optimized in response to variations in input signal level.

12 Claims, 5 Drawing Sheets

AUTOMATIC LEVEL CONTROL CIRCUIT FOR AN AD CONVERTOR

This is a Continuation of application Ser. No. 795,142 filed Nov. 5, 1985, now agandoned.

BACKGROUND OF THE INVENTION

The present invention relates to an automatic level control circuit and, more particularly, to an automatic level control circuit applicable to a demodulator of a multi-level quadrature amplitude modulation (QAM) system and others.

The current trend in the art of microwave band digital communications is toward the use of a multi-level QAM system which enhances effective utilization of the limited frequency band. In such a communication system, an analog-to-digital (AD) converter at a receive terminal compares a demodulated baseband signal with a plurality of predetermined reference levels to thereby transform the baseband signal into two-level parallel digital signals. In this instance, the prerequisite is that the input level of the baseband signal to the AD converter is maintained constant relative to the reference levels despite possible changes in the receive level and those in the gain of a receive amplifier.

The above prerequisite has heretofore been met by installing variable-gain amplifiers one before a QAM detector and the other after the QAM detector and controlling their gains by means of outputs of AD converters.

The problem with the prior art implementation is that, as will also be discussed later in detail, the use of variable-gain amplifiers which are adapted for stabilization of signal level makes the circuit construction complicated and, thereby, brings about the need for extra steps and time for the adjustment of variable-gain amplifiers in the production line.

SUMMARY OF THE INVENTION

It is therefore an object of the present invention to provide an automatic level control circuit for use in a multi-level signal transmission system which is practicable with a simple construction.

An automatic level control circuit of the present invention comprises an AD converter for discriminating an input multi-level signal with respect to a plurality of reference levels to produce a decoded digital signal and an error digital signal, and a reference voltage generator including logic circuit means, responsive to the decoded digital signal and error digital signal for providing reference voltages to the AD converter to uniformly shift said plurality of reference levels. The reference levels assigned to the AD converter are controlled to optimum ones responsive to a fluctuation in the level of the input signal.

BRIEF DESCRIPTION OF THE DRAWINGS

The above and other objects, features and advantages of the present invention will become more apparent from the following detailed description taken with the accompanying drawings in which.

DETAILED DESCRIPTION OF THE INVENTION

Figure 1:
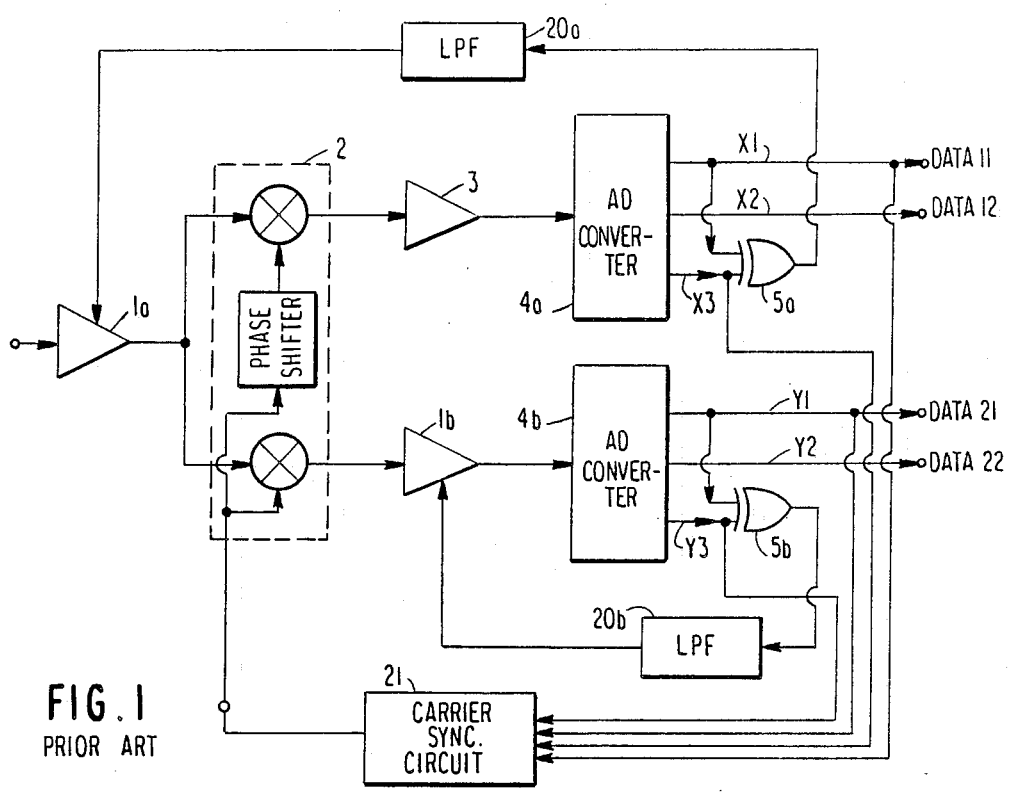
FIG. 1 is a block diagram showing a prior art 16-level QAM demodulator, which includes an automatic level control circuit.
Figure 2:
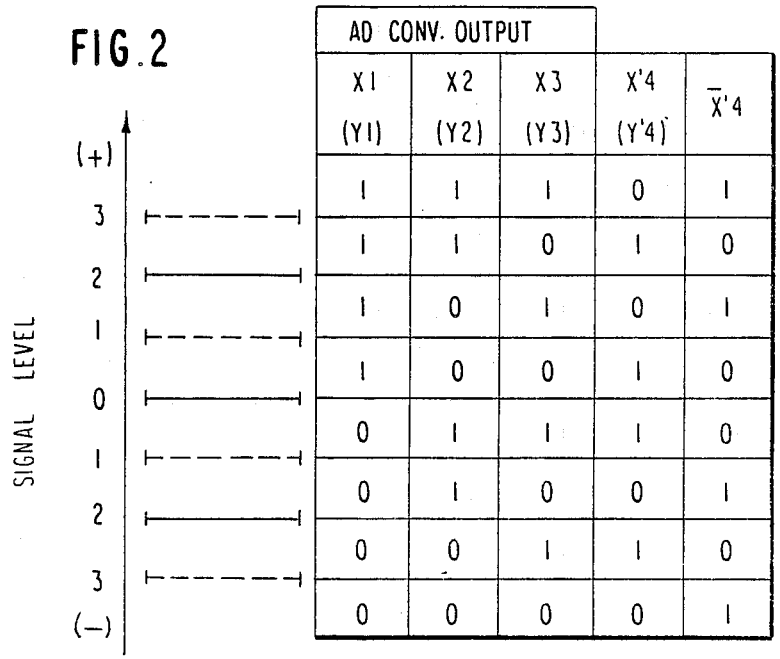
FIG. 2 is a discrimination domain map associated with a 4-level baseband signal.

Referring to FIG. 1 of the drawings, a prior art 16-level QAM (16 QAM) demodulator is shown. As shown, a received intermediate frequency (IF) signal is applied to a QAM detector 2 via a variable-gain amplifier 1a. The QAM detector 2 detects the IF signal by using reference signals which are shifted 90 degrees in phase relative to each other, thereby producing two parallel streams of demodulated signals. One of the demodulated signal streams is routed through an amplifier 3 to an AD converter 4a, and the other through a variable-gain amplifier 1b to an AD converter 4b. As shown in FIG. 2, each of the AD converters 4a and 4b is provided with four different error discrimination levels (dotted lines) and three different code discrimination levels (solid lines) in order to convert the input to three-bit outputs ($X_1$, $X_2$ and $X_3$). Among the outputs $X_1$–$X_3$, the outputs $X_1$ and $X_2$ represent reproduced decoded outputs (DATA 11 and 12) associated with the detected baseband signal, while $X_3$ is an error output for determining a deviation of the input signal from a reference level. The first-and third-bit outputs $X_1$ and $X_3$ are applied to an Exclusive-OR (Ex-OR) gate 5a which provides a value $X_4'$ as shown in FIG. 2 in response to the input signal level. Specifically, the value $X_4'$ becomes a ZERO when the input signal level is higher than the reference level and a ONE when the former is lower than the latter.

Similarly, the AD converter 4b provides the three-bit outputs $Y_1$, $Y_2$ and $Y_3$. The outputs $Y_1$ and $Y_3$ are applied to an EX-OR gate 5b which provides a value $Y_4'$ in response to the input signal level.

By controlling the variable-gain amplifiers 1a and 1b by the outputs of the Ex-OR gates 5a and 5b via low-pass filters (LPF) 20a and 20b, respectively, it is possible to stabilize gain fluctuations common to the quadrature components, and gain fluctuations particular to the individual quadrature components which are attributable to variations in the circuit characteristics.

The reference numeral 21 designates a carrier synchronizing circuit adapted to generate a reference signal for the QAM detector 2 responsive to the outputs $X_1$ and $X_3$ of the AD converter 4a and the outputs $Y_1$ and $Y_3$ of the Ad converter 4b.

The prior art system described above has the disadvantage that it cannot avoid a relatively complicated circuit arrangement due to the use of variable-gain amplifiers and, therefore, requires extra steps and time for adjusting the amplifiers in the production line.

For details of such a prior art system, a reference may be made to European Patent Application Publication No. 0 120 416.

Figure 3:
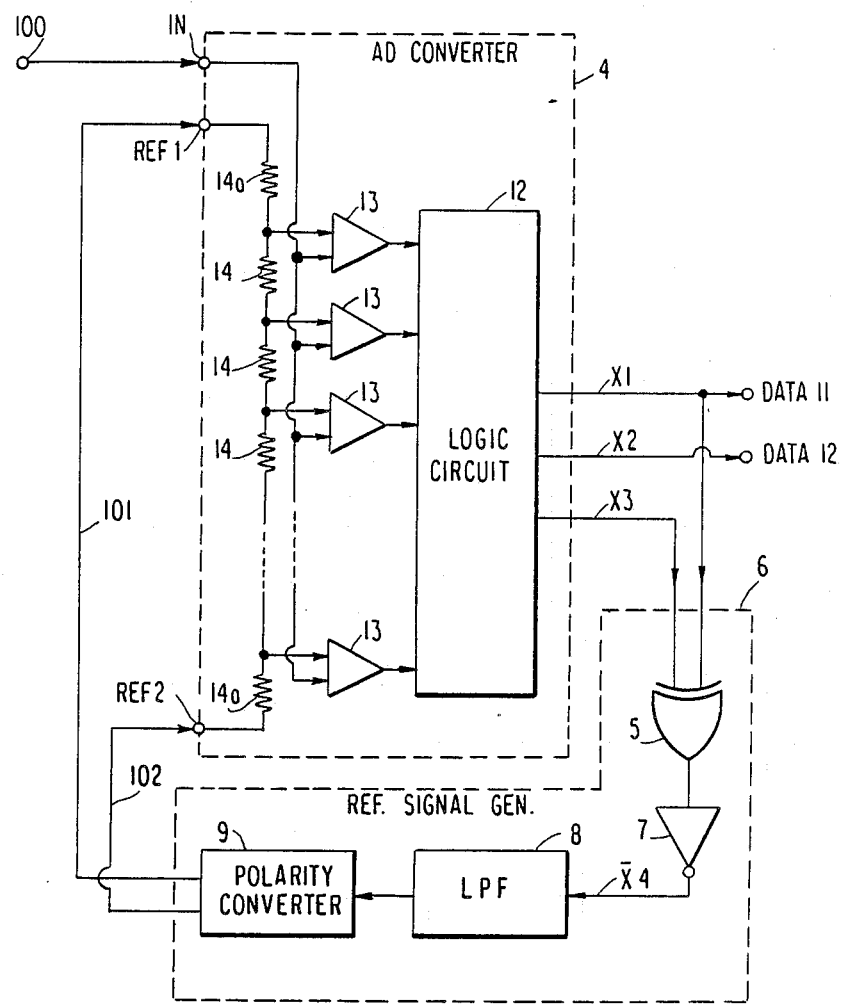
FIG. 3 is a block diagram of an automatic level control circuit for an AD converter embodying the present invention.

Referring now to FIG. 3, an automatic level control circuit for an AD converter embodying the present invention is shown. As shown, the circuit comprises an AD converter adapted to transform an input signal into 3-bit digital signals by multi-level discrimination, and a reference voltage generator 6 adapted to logically process the outputs of the AD converter 4. The outputs of the reference signal generator 6 are applied to the AD converter 4 to control reference levels which are assigned to the AD converter 4.

In detail, the AD converter 4 includes seven comparators 13 to which the reference levels shown in FIG. 2 are assigned. An input signal 100 (baseband signal provided by QAM-detection of a 16-level QAM wave) is applied to an input terminal IN of the AD converter 4 and compared by the comparators 13 with the respective reference levels. The outputs of the comparators 13 are applied to a logic circuit 12 which then produces three-bit output signals $X_1$, $X_2$ and $X_3$. The reference levels, or voltages, associated with the respective comparators 13 are generated by dividing DC voltages applied to reference voltage terminals REF1 and REF2 of the AD converter 4 by means of a series connection of multiple voltage dividing resistors and 14a.

Among the outputs $X_1$-$X_3$ of the AD converter 4, $X_1$ and $X_3$ are applied to an Ex-OR gate 5 which is included in the reference voltage generator 6. The output of the Ex-OR gate 5 is delivered to an inverter 7 whose output $\overline{X_4}'$ is coupled to an LPF 8. The LPF 8 separates a DC component from the input and applies it to a polarity converter 9 with the result that the DC component is transformed into two reference voltages 101 and 102 which are the same in level but opposite in polarity. The reference voltages 101 and 102 respectively are coupled to the reference voltage terminals REF1 and REF2 of the AD converter 4.

In the construction described above, the output $\overline{X_4}'$ of the inverter 7 becomes a ONE when the level of the input signal 100 has fluctuated to a level higher than the reference level and becomes a ZERO when it has fluctuated to a level lower than the reference level. The positive and negative reference voltages applied to the AD converter 4 increase responsive to a change of the signal $\overline{X_4}'$ to a ONE so as to increase the distance between each adjacent reference level (although the center reference level is unchanged), while distance responsive to a change of the signal $\overline{X_4}'$ to a ZERO. This allows the distance between the input level and each reference level to be successfully controlled to an optimum one.

Figure 4:
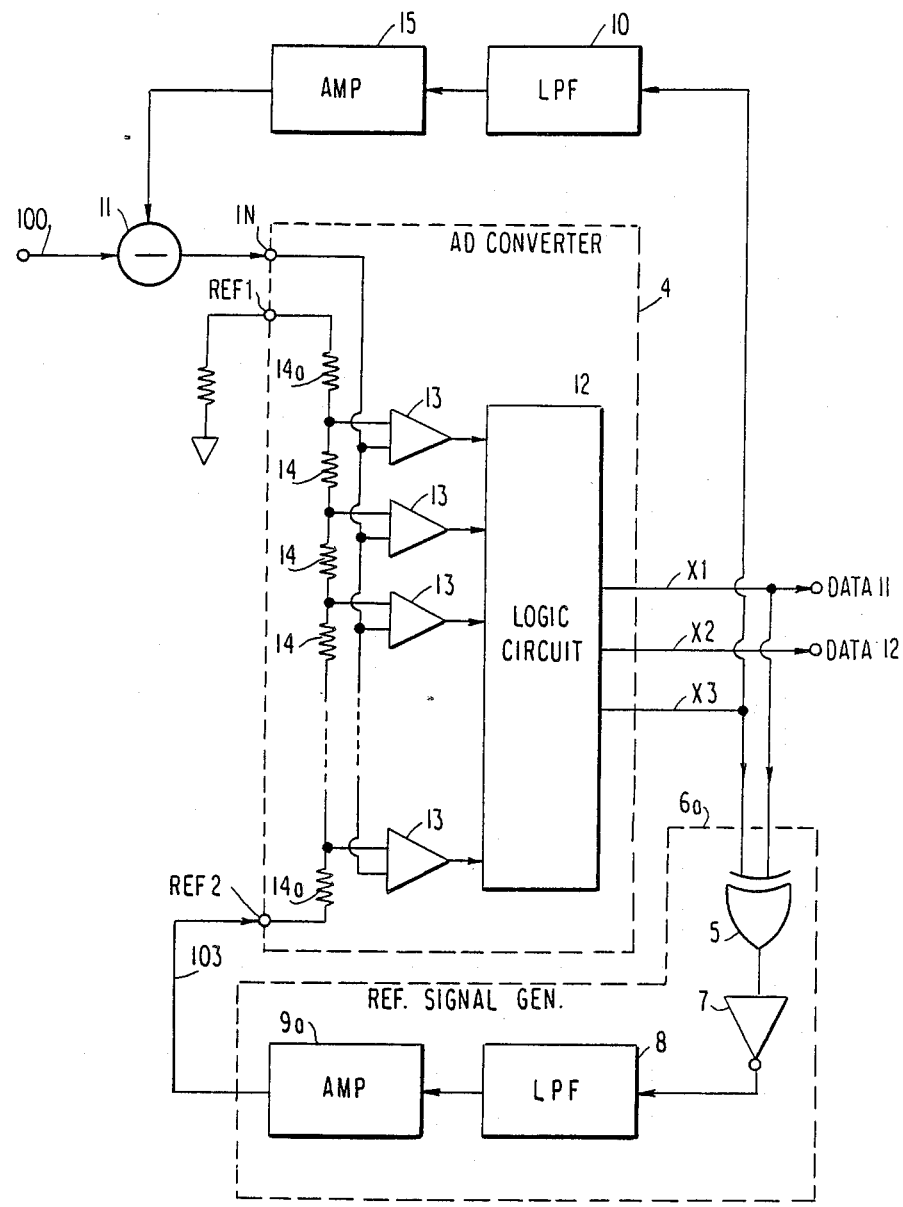
FIG. 4 is a block diagram showing another embodiment of the present invention.

Referring to FIG. 4, another embodiment of the present invention is shown. In this particular embodiment, the automatic level control circuit comprises the AD converter 4, a reference voltage generator 6a, a subtractor 11 for applying subtration to the input signal 100, an LPF 10, and an amplifier 15.

In FIG. 4, the reference voltage generator 6a uses an inverting amplifier 9a in place of the polarity converter 9 of FIG. 3 so that a negative reference voltage 103 is applied to the reference voltage terminal REF2 of the AD converter 4. The other reference voltage terminal REF1 of the AD converter 4 is connected to ground via a protective resistor. In such a circuit arrangement, a change in the output of the reference voltage generator 6a causes not only the distance between adjacent reference levels but also the center reference level to change. To compensate for such an occurrence, the error signal $X_3$ from AD converter 4 is routed to the subtractor 11 via the LPF 10 and amplifier 15.

The circuit in accordance with this particular embodiment is capable of adjusting the distance between adjacent reference levels to an optimum one responsive to any fluctuation in the input level and, besides, coping with the drift of a DC component which is superposed on the input as well as DC drifts particular to the circuit.

It should be noted that the DC component compensation circuitry inclusive of the subtractor 11 as shown in FIG. 4 is applicable in the same manner to the arrangement shown in FIG. 3. It should also be noted that the same circuit arrangement is applicable to input signals other than four-level signals. In an actual 16 QAM demodulator, the circuit of FIG. 3 or 4 will be directly connected to each of the output components of the QAM detector 2 of FIG. 1

Figure 5:
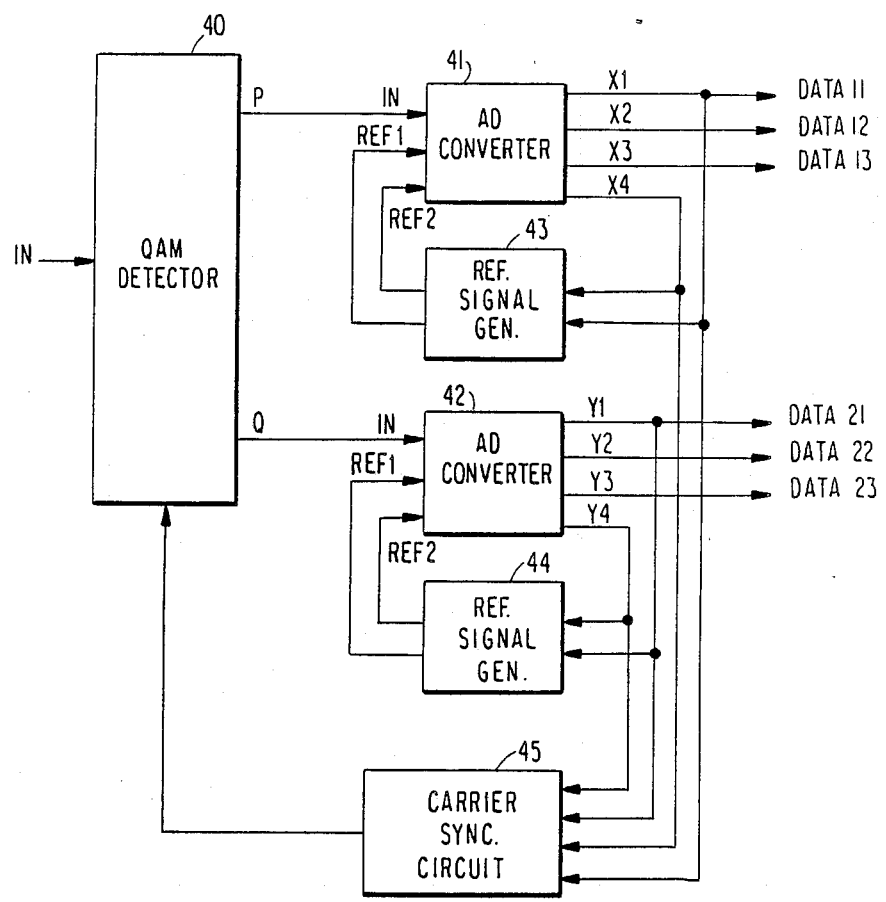
FIGS. 5 and 6 are block diagrams representative of two different applications of the automatic level control circuit of the present invention to a 64-level QAM demodulator.

Referring to FIG. 5, a 64 QAM demodulator is shown which is made up of a QAM detector 40, 4-bit AD converters 41 and 42, reference signal generators 43 and 44, and a carrier synchronizing circuit 45. The QAM detector 40 and the carrier synchronizing circuit 45 respectively are constructed in the same manner as the circuits 2 and 21 of FIG. 1, while the reference signal generator 43 or 44 is constructed in the same manner as the circuit 6 of FIG. 3 or the circuit 6 of FIG. 4. The QAM detector 40 is adapted to detect a 64 QAM signal output from the carrier synchronizing circuit 45 and, thereby, produce quadrature signals P and Q. The AD converter 1 converts the output P of the QAM detector 40 to 4-bit digital signals $X_1$-$X_4$ responsive to reference voltages which are applied thereto from the reference signal generator 43. Among the signals $X_1$-$X_4$, $X_1$-$X_3$ are delivered as reproduced data DATA11-DATA13, while the signal $X_4$ is applied to the reference signal generator 43 together with the signal $X_1$ to be processed in the same manner as in FIG. 3. Likewise, the AD converter 42 converts the output Q of the QAM detector 40 to 4-bit digital signals $Y_1$-$Y_4$ responsive to reference voltages which are applied thereto from the reference signal generator 44. The signals $Y_1$-$Y_3$ are delivered as reproduced data DATA21-23, while the signal $Y_4$ is applied to the reference signal generator 44 together with the signal $Y_1$.

Figure 6:
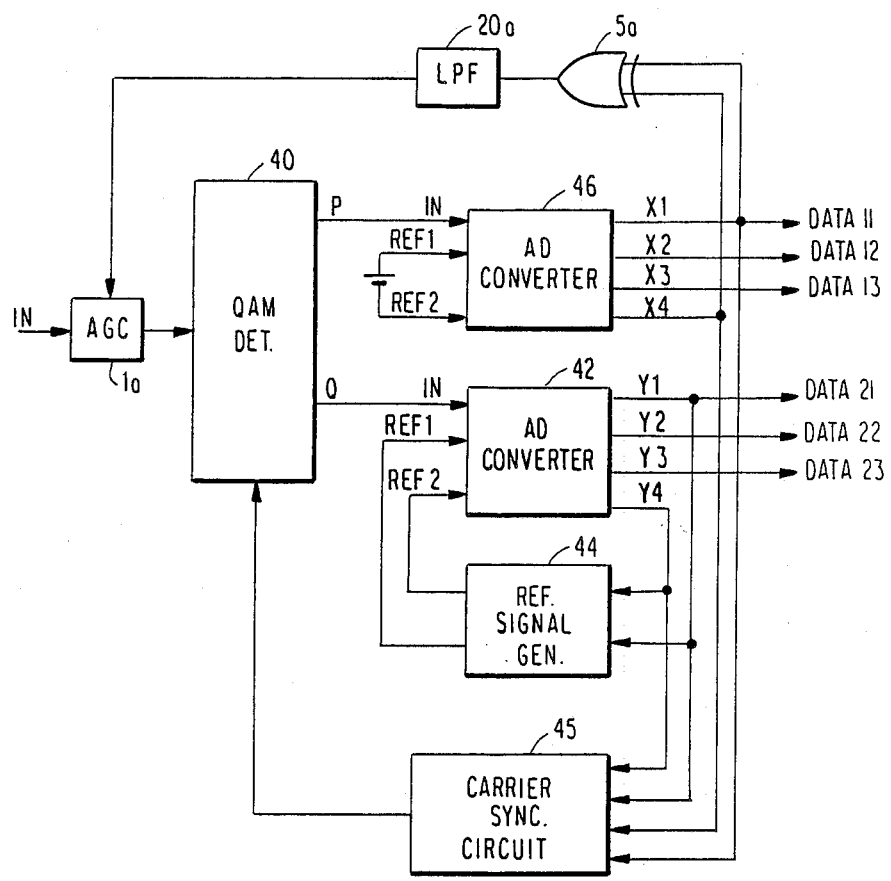

Referring to FIG. 6, another application of the present invention to a 64 QAM demodulator is shown. In FIG. 6, blocks 40, 42, 44 and 45 are the same as those blocks of FIG. 5 which are designated by like reference numerals, and blocks 1a, 5a and 20a those of FIG. 1. In FIG. 6, fixed voltages are coupled to the terminals REF1 and REF2 of the AD converter 46, while outputs of the reference signal generator 44 are coupled to those of the AD converter 42 as has been the case with the arrangement of FIG. 5. The automatic gain controlled (AGC) circuit 1a which is connected to an input terminal of the QAM detector 40 functions to compensate for the level difference between the outputs P and Q of the detector 40 only. Advantageous features of such a circuit arrangement will be more clearly understood when compared with the previously stated publication.

In summary, it will be seen that the present invention provides an automatic level control circuit which is capable of optimumly controlling the reference levels of AD converters against fluctuations of input level without resorting to variable-gain amplifiers, thereby achieving a simple construction and promoting the ease of adjustment.

Various modifications will become possible for those skilled in the art after receiving the teachings of the present disclosure without departing from the scope thereof.

What is claimed is:

1. An automatic level control circuit for use in a multi-level signal transmission system comprising an analog-to-digital (A/D) converter for discriminating a demodulated multi-level baseband signal with respect to a plurality of reference levels to produce a plurality of decoded digital signals and an error digital signal, and a reference voltage generator, including logic circuit means, responsive to for providing a reference voltage to said A/D converter to uniformly shift said plurality of reference levels, said reference levels being controlled to optimum ones responsive to a variation in the level of said input signal.

2. An automatic level control circuit as claimed in claim 1, wherein said reference voltage generator comprises an Exclusive-OR gate responsive to one of said decoded digital signals and said error digital signal, and a lowpass filter for smoothing the output of said Exclusive-OR gate to provide said reference voltage.

3. An automatic level control circuit as claimed in claim 1, wherein said reference voltage generator comprises an Exclusive-OR gate responsive to one of said decoded digital signals and said error digital signal, a lowpass filter for smoothing the output of said Exclusive-OR gate, and a polarity converter responsive to the output of said lowpass filter for providing said reference voltage.

4. An automatic level control circuit as claimed in claim 1, wherein said reference voltage generator comprises an Exclusive-OR gate responsive to one of said decoded digital signals and said error digital signal, a lowpass filter for smoothing the output of said Exclusive-OR gate, and an amplifier responsive to the output of said lowpass filter for providing said reference voltage.

5. An automatic level control circuit as claimed in claim 1, comprising a detector for detecting a quadrature amplitude-modulated carrier wave with a carrier wave and providing said demodulated multi-level baseband signal.

6. An automatic level control circuit as claimed in claim 1, comprising means for changing the level of said demodulated multi-level baseband signal in response to said error digital signal.

7. A multi-level QAM demodulator for converting multi-level QAM signal into a plurality of digital data signals including a QAM detector means responsive to an input QAM signal for producing quadrature phase (Q) and in-phase (P) demodulated multi-level baseband signals, a first multi-level discriminator means for discriminating said in-phase demodulated multi-level baseband signal and a second multi-level discriminator means for discriminating said quadrature phase demodulated multi-level baseband signals, each discriminator means operating in response to multiple level reference signals and generating digital output signals and a carrier sync circuit connected to synchronize said output signals and said detector means, the improvement wherein:

each said first and second multi-level discriminator means is adapted to discriminate a demodulated multi-level baseband signal with respect to a plurality of reference levels and to produce a plurality of decoded digital signals and an error digital signal, and said multi-level reference signals are provided and uniformly changed by at least one reference voltage generator, including logic circuit means, responsive to one of the decoded digital signals and said error digital signal.

8. A multi-level QAM demodulator as claimed in claim 7, wherein said reference voltage generator comprises an Exclusive-OR gate responsive to one of said decoded digital signals and said error digital signal, and a lowpass filter for smoothing the output of said Exclusive-OR gate to provide said reference voltage.

9. A multi-level QAM demodulator as claimed in claim 5, wherein the output of said reference voltage generator is applied to said first and said second multi-level discriminator means and comprises an Exclusive-OR gate responsive to one of said decoded digital signals and said error digital signal, a lowpass filter for smoothing the output of said Exclusive-OR gate, and a polarity converter responsive to the output of said lowpass filter for providing said reference voltage.

10. A multi-level QAM demodulator as claimed in claim 5, wherein said reference voltage generator comprises an Exclusive-OR gate responsive to one of said decoded digital signals and said error digital signal, a lowpass filter for smoothing the output of said Exclusive-OR gate, and an amplifier responsive to the output of said lowpass filter for providing said reference voltage.

11. A multi-level QAM demodulator as claimed in claim 5, wherein said second discriminator means receives the variable output of said reference voltage generator and said first discriminator means receives fixed reference voltages from a source of fixed reference voltages.

12. A multi-level QAM demodulator as claimed in claim 11, wherein said multi-level QAM signals are connected to a first control circuit for varying the amplitude of said signals in response to a first control signal and a first control signal generator for generating said first control signal in response to the output of said second discriminator means.

* * * * *

UNITED STATES PATENT AND TRADEMARK OFFICE
CERTIFICATE OF CORRECTION

PATENT NO. : 4,875,049

DATED : October 17, 1989

INVENTOR(S) : Yoshida

It is certified that error appears in the above-identified patent and that said Letters Patent is hereby corrected as shown below:

On the title page, item [57]:

Abstract, line 5, delete "camer";

Column 2, line 55, delete "Ad", insert --AD--;

Column 3, line 41, after "while", insert --decreasing the--.

Column 3, line 68, after "level", insert --. It also is capable of-- and delete "and, besides,".

Signed and Sealed this

Tenth Day of December, 1991

Attest:

HARRY F. MANBECK, JR.

*Attesting Officer*       *Commissioner of Patents and Trademarks*